(12) United States Patent
Chuang et al.

(10) Patent No.: US 8,346,713 B2
(45) Date of Patent: Jan. 1, 2013

(54) METHOD AND SYSTEM FOR RECOGNIZING POWER CONSUMPTION BEHAVIORS OF ELECTRIC APPLIANCES IN A LOOP

(75) Inventors: Chi-Cheng Chuang, Kaohsiung County (TW); Ray-I Chang, Taipei (TW); Hung-Ren Lai, Hualien County (TW)

(73) Assignee: Institute for Information Industry, Taipei (TW)

( * ) Notice: Subject to any disclaimer, the term of this patent is extended or adjusted under 35 U.S.C. 154(b) by 523 days.

(21) Appl. No.: 12/632,779

(22) Filed: Dec. 7, 2009

(65) Prior Publication Data
US 2011/0125703 A1 May 26, 2011

(30) Foreign Application Priority Data
Nov. 20, 2009 (TW) ................. 98139594 A

(51) Int. Cl.
*G06F 15/00* (2006.01)
(52) U.S. Cl. ........ 706/62; 340/870.01; 702/61; 716/109
(58) Field of Classification Search .................. 706/62; 340/870.01; 702/61; 716/109
See application file for complete search history.

(56) References Cited

U.S. PATENT DOCUMENTS
2004/0081099 A1 4/2004 Patterson et al.
2007/0200553 A1 8/2007 Morrison FOREIGN PATENT DOCUMENTS
| | | |
|---|---|---|
| CN | 2482252 | 3/2002 |
| CN | 1852313 | 10/2006 |
| CN | 200989922 | 12/2007 |
| CN | 201278000 | 7/2009 |
| EP | 2026299 A1 * | 2/2009 |

OTHER PUBLICATIONS

Laughman et al ("Power Signature Analysis" 2003).*
Chuang et al ("Non-intrusive Appliance Monitoring Now: Effective Data, Generative Modelling and LETE" 2011).*
"First Office Action of China Counterpart Application", issued on Jul. 24, 2012, pp. 1-5.

* cited by examiner

*Primary Examiner* — Lut Wong
(74) *Attorney, Agent, or Firm* — Jianq Chyun IP Office

(57) ABSTRACT

A method and a system for recognizing power consumption behaviors of electric appliances in a loop are provided. When a variation value of a power consumption information of the loop exceeds a threshold, a current value of the power consumption information is served as a main loop factor value of the loop, and a similar combinative factor value close to the main loop factor value is looked up in a behavior-factor mapping table. If the similar combinative factor value is not found, the main loop factor value corresponding to a new power consumption behavior is obtained according to the variation value of the power consumption information to reconstruct the behavior-factor mapping table. After obtaining the similar combinative factor value from the behavior-factor mapping table, a current electric appliance power consumption behavior of the loop is determined according to a power consumption behavior combination corresponding to the similar combinative factor value.

19 Claims, 4 Drawing Sheets

| Power consumption behavior combination | Combinative factor value |
|---|---|
| A off B off | 0 |
| A off B on | 125 |
| A high B off | 35 |
| A high B on | 160 |
| A low B off | 25 |
| A low B on | 150 |

| Power consumption behavior combination | Combinative factor value |
|---|---|
| A off B off C off | 0 |
| A off B off C on | 210 |
| A off B on C off | 125 |
| A off B on C on | 335 |
| A high B off C off | 35 |
| A high B off C on | 245 |
| A high B on C off | 160 |
| A high B on C on | 370 |
| A low B off C off | 25 |
| A low B off C on | 235 |
| A low B on C off | 150 |
| A low B on C on | 360 |

METHOD AND SYSTEM FOR RECOGNIZING POWER CONSUMPTION BEHAVIORS OF ELECTRIC APPLIANCES IN A LOOP

CROSS-REFERENCE TO RELATED APPLICATION

This application claims the priority benefit of Taiwan application serial no. 98139594, filed on Nov. 20, 2009. The entirety of the above-mentioned patent application is hereby incorporated by reference herein and made a part of specification.

BACKGROUND OF THE INVENTION

1. Field of the Invention

The present invention generally relates to a method for obtaining power consumption information, and more particularly, to a method and a system for recognizing the power consumption behaviors of electric appliances by taking a loop as a unit.

2. Description of Related Art

The concepts of environmental protection and energy conservation have been brought up and increasingly focused along with the decrease of petroleum, electricity, and other natural resources. According to statistical data, about 39% of all energy resources is consumed in our residential environment. Thus, smart meters with energy calculation and management functions are used in more and more buildings in order to provide different power consumption information related to the residential environment in real time.

Generally speaking, the most direct method of understanding the power consumption status of each electric appliance in a building is to dispose a measuring device (for example, a small electricity meter) on each electric appliance. In addition, if the power consumption status of each electric appliance is to be collected and analyzed, a radio frequency (RF) communication device or a power line communication (PLC) device needs to be installed on the electric appliance or the panel meter such that the power consumption information of the electric appliance can be sent to a backend platform to be analyzed. However, if there are too many electric appliances in a building, the method of disposing a measuring device and a communication device on each of the electric appliances will be too labor-consuming and cost-consuming.

On the other hand, even though some electric appliances with built-in power measurement devices in the market can obtain their own power consumption information, the prices of these electric appliances are usually too high. Furthermore, external measuring devices and communication devices still have to be disposed on existing electric appliances in a building to obtain the power consumption information thereof if not all the electric appliances in the building are replaced.

SUMMARY OF THE INVENTION

Accordingly, the present invention is directed to a method for recognizing the power consumption behaviors of electric appliances in a loop, wherein the power consumption behaviors of the electric appliances are recognized by taking the loop as a unit.

The present invention is directed to a system for recognizing the power consumption behaviors of electric appliances in a loop, wherein factor values are constructed according to a single power consumption information so as to recognize the power consumption behaviors of the electric appliances in the loop.

The present invention provides a method for recognizing the power consumption behaviors of electric appliances in a loop. In the present method, when a variation value of a single power consumption information of the loop exceeds a threshold, a current value of the power consumption information is served as a main loop factor value of the loop, and whether a similar combinative factor value close to the main loop factor value exists in the behavior-factor mapping table is determined. If the similar combinative factor value close to the main loop factor value does not exist in the behavior-factor mapping table, the main loop factor value corresponding to a new power consumption behavior is obtained according to the variation value of the power consumption information. The behavior-factor mapping table is then reconstructed by using the main loop factor value corresponding to the new power consumption behavior, and a plurality of combinative factor values and a plurality of corresponding power consumption behavior combinations are recorded in the behavior-factor mapping table. Next, the similar combinative factor value close to the main loop factor value is obtained from the combinative factor values, and a current electric appliance power consumption behavior of the loop is determined according to the power consumption behavior combination corresponding to the similar combinative factor value.

According to an embodiment of the present invention, after the step of determining whether the similar combinative factor value exists in the behavior-factor mapping table, the current electric appliance power consumption behavior of the loop is determined according to the power consumption behavior combination corresponding to the similar combinative factor value if the similar combinative factor value exists in the behavior-factor mapping table.

According to an embodiment of the present invention, in the step of determining whether the similar combinative factor value exists in the behavior-factor mapping table, the similar combinative factor value is determined to exist if the difference between a combinative factor value recorded in the behavior-factor mapping table and the main loop factor value is within a specific range.

According to an embodiment of the present invention, in the step of obtaining the main loop factor value corresponding to the new power consumption behavior according to the variation value of the power consumption information, a plurality of continuous values is obtained according to the variation value of the power consumption information, wherein the difference between any two of the values is within a stable range. The values are sorted to obtain a stationary statistic, and the stationary statistic is deducted from a previous value of the power consumption information of the loop to generate the main loop factor value corresponding to the new power consumption behavior.

According to an embodiment of the present invention, in the step of reconstructing the behavior-factor mapping table by using the main loop factor value corresponding to the new power consumption behavior and recording the combinative factor values and the corresponding power consumption behavior combinations into the behavior-factor mapping table, a behavior type of the new power consumption behavior is defined. If the behavior-factor mapping table contains a plurality of existing power consumption behavior combinations, the new power consumption behavior and the existing power consumption behavior combinations are permuted to generate new power consumption behavior combinations. A sum of the main loop factor values corresponding to the power consumption behaviors within each of the power consumption behavior combinations is served as the corresponding combinative factor value.

According to an embodiment of the present invention, in the present method for recognizing the power consumption behaviors of the electric appliances in the loop, when the behavior-factor mapping table contains no existing power consumption behavior combination, the new power consumption behavior is inserted into the behavior-factor mapping table as the first power consumption behavior combination, and the main loop factor value corresponding to the new power consumption behavior is served as the combinative factor value of the power consumption behavior combination.

According to an embodiment of the present invention, in the step of serving the current value of the power consumption information as the main loop factor value of the loop when the variation value of the power consumption information of the loop exceeds the threshold, the time for the variation value of the power consumption information to stabilize is further obtained and served as a loop accessorial factor value of the loop, and in the step of obtaining the main loop factor value corresponding to the new power consumption behavior according to the variation value of the power consumption information of the loop, the time for the variation value of the power consumption information to stabilize is further obtained and served as a loop accessorial factor value of the new power consumption behavior.

According to an embodiment of the present invention, in the step of reconstructing the behavior-factor mapping table by using the main loop factor value corresponding to the new power consumption behavior, a mapping relationship between the new power consumption behavior and the loop accessorial factor value is further recorded into a time-factor mapping table.

According to an embodiment of the present invention, in the step of determining the current electric appliance power consumption behavior of the loop according to the power consumption behavior combination corresponding to the similar combinative factor value, whether the similar combinative factor value is unique is determined. If the similar combinative factor value is unique, it is determined that the current electric appliance power consumption behavior of the loop conforms to the power consumption behavior combination corresponding to the similar combinative factor value.

According to an embodiment of the present invention, if the similar combinative factor value is not unique, a previous electric appliance power consumption behavior of the loop is compared with the power consumption behavior combinations corresponding to all the similar combinative factor values, so as to determine the current electric appliance power consumption behavior of the loop.

According to an embodiment of the present invention, if the similar combinative factor value is not unique, the previous electric appliance power consumption behavior of the loop is compared with the power consumption behavior combinations corresponding to all the similar combinative factor values, or the loop accessorial factor value is further compared with the time-factor mapping table, so as to determine the current electric appliance power consumption behavior of the loop.

According to an embodiment of the present invention, in the present method for recognizing the power consumption behaviors of the electric appliances in the loop, a variation value of the power consumption information on each of a plurality of existing electric appliances under each of a plurality of power consumption behaviors of the existing electric appliance is further collected, so as to obtain the main loop factor value and the loop accessorial factor value corresponding to the power consumption behavior. The power consumption behaviors of the existing electric appliances are permuted to generate a plurality of existing power consumption behavior combinations. A sum of the main loop factor values corresponding to the power consumption behaviors within each of the existing power consumption behavior combinations is served as an existing combinative factor value corresponding to the existing power consumption behavior combination. The existing power consumption behavior combinations and the corresponding existing combinative factor values are recorded into the behavior-factor mapping table, and the power consumption behaviors of the existing electric appliances and the corresponding loop accessorial factor values are recorded into the time-factor mapping table.

According to an embodiment of the present invention, the power consumption information includes one of power, volt-ampere, volt, watt-hour, kilowatt-hour, reactive power, and current.

The present invention provides a system for recognizing the power consumption behaviors of electric appliances in a loop. The system includes a power consumption information sensor, a behavior-factor mapping table establishing module, and a recognition module. The power consumption information sensor detects the value of a single power consumption information of the loop. The behavior-factor mapping table establishing module provides a behavior-factor mapping table. The recognition module is coupled to the power consumption information sensor and the behavior-factor mapping table establishing module. When a variation value of the power consumption information of the loop exceeds a threshold, the recognition module serves a current value of the power consumption information as a main loop factor value of the loop and determines whether a similar combinative factor value close to the main loop factor value exists in the behavior-factor mapping table. If the similar combinative factor value close to the main loop factor value does not exist in the behavior-factor mapping table, the recognition module obtains the main loop factor value corresponding to a new power consumption behavior according to the variation value of the power consumption information of the loop and notifies the behavior-factor mapping table establishing module to reconstruct the behavior-factor mapping table by using the main loop factor value corresponding to the new power consumption behavior, and the recognition module also records a plurality of combinative factor values and a plurality of corresponding power consumption behavior combinations into the behavior-factor mapping table. The recognition module obtains the similar combinative factor value close to the main loop factor value of the loop from the combinative factor values and determines a current electric appliance power consumption behavior of the loop according to the power consumption behavior combination corresponding to the similar combinative factor value.

According to an embodiment of the present invention, if the similar combinative factor value close to the main loop factor value of the loop exists in the behavior-factor mapping table, the recognition module determines the current electric appliance power consumption behavior of the loop according to the power consumption behavior combination corresponding to the similar combinative factor value.

According to an embodiment of the present invention, the recognition module determines that the similar combinative factor value exists when the difference between a combinative factor value recorded in the behavior-factor mapping table and the main loop factor value of the loop is within a specific range.

According to an embodiment of the present invention, the recognition module obtains a plurality of continuous values according to the variation value of the power consumption information, gathers statistic on the values to obtain a stationary statistic, and deducts the stationary statistic from a previous value of the power consumption information of the loop to obtain the main loop factor value corresponding to the new power consumption behavior, wherein the difference between any two of the values is within a stable range.

According to an embodiment of the present invention, the behavior-factor mapping table establishing module obtains a behavior type of the new power consumption behavior. If the behavior-factor mapping table contains a plurality of existing power consumption behavior combinations, the behavior-factor mapping table establishing module permutes the new power consumption behavior and the existing power consumption behavior combinations to generate new power consumption behavior combinations. The behavior-factor mapping table establishing module also serves a sum of the main loop factor values corresponding to the power consumption behaviors within each of the power consumption behavior combinations as the corresponding combinative factor value.

According to an embodiment of the present invention, if the behavior-factor mapping table contains no existing power consumption behavior combination, the behavior-factor mapping table establishing module inserts the new power consumption behavior into the behavior-factor mapping table as the first power consumption behavior combination and serves the main loop factor value corresponding to the new power consumption behavior as the combinative factor value of the power consumption behavior combination.

According to an embodiment of the present invention, when the variation value of the power consumption information of the loop exceeds the threshold, the recognition module obtains the time for the variation value of the power consumption information to stabilize as a loop accessorial factor value of the loop. While obtaining the main loop factor value corresponding to the new power consumption behavior according to the variation value of the power consumption information of the loop, the recognition module further obtains the time for the variation value of the power consumption information to stabilize as a loop accessorial factor value of the new power consumption behavior.

According to an embodiment of the present invention, the system for recognizing the power consumption behaviors of the electric appliances in the loop further includes a time-factor mapping table establishing module coupled to the recognition module. The time-factor mapping table establishing module records a mapping relationship between the new power consumption behavior and the loop accessorial factor value thereof into a time-factor mapping table.

According to an embodiment of the present invention, the recognition module determines whether the similar combinative factor value is unique. If the similar combinative factor value is unique, the recognition module determines that the current electric appliance power consumption behavior of the loop conforms to the power consumption behavior combination corresponding to the similar combinative factor value.

According to an embodiment of the present invention, if the similar combinative factor value is not unique, the recognition module compares a previous electric appliance power consumption behavior of the loop with the power consumption behavior combinations corresponding to all the similar combinative factor values, so as to determine the current electric appliance power consumption behavior of the loop.

According to an embodiment of the present invention, if the similar combinative factor value is not unique, the recognition module compares the previous electric appliance power consumption behavior of the loop with the power consumption behavior combinations corresponding to all the similar combinative factor values or further compares the loop accessorial factor value of the loop with the time-factor mapping table, so as to determine the current electric appliance power consumption behavior of the loop.

According to an embodiment of the present invention, the behavior-factor mapping table establishing module collects the main loop factor value corresponding to the new power consumption behavior obtained according to the variation value of the power consumption information on each of a plurality of existing electric appliances in the loop under each of a plurality of power consumption behaviors of the existing electric appliance. The behavior-factor mapping table establishing module permutes the power consumption behaviors of the existing electric appliances to generate a plurality of existing power consumption behavior combinations. The behavior-factor mapping table establishing module serves a sum of the main loop factor values corresponding to the power consumption behaviors within each of the existing power consumption behavior combinations as an existing combinative factor value corresponding to the existing power consumption behavior combination. The behavior-factor mapping table establishing module records the existing power consumption behavior combinations and the corresponding existing combinative factor values into the behavior-factor mapping table.

According to an embodiment of the present invention, the time-factor mapping table establishing module collects the loop accessorial factor value corresponding to the new power consumption behavior obtained according to the variation value of the power consumption information on each of the existing electric appliances under each of the power consumption behaviors of the existing electric appliance and records the power consumption behaviors of the existing electric appliances and the corresponding loop accessorial factor values into the time-factor mapping table.

According to an embodiment of the present invention, the system for recognizing the power consumption behaviors of the electric appliances in the loop further includes a result output device coupled to the recognition module, wherein the result output device displays the current electric appliance power consumption behavior of the loop.

According to an embodiment of the present invention, the power consumption information includes one of power, volt-ampere, volt, watt-hour, kilowatt-hour, reactive power, and current.

According to an embodiment of the present invention, the power consumption information sensor includes one of an ammeter, an electricity meter, a watt-hour meter, and a power meter.

As described above, in the present invention, the factors of power consumption behaviors corresponding to different electric appliances are constructed according to the value variation of a single power consumption information, and the factor values of different power consumption behavior combinations are then defined. Accordingly, after obtaining a loop factor value according to the current variation value of the power consumption information of the loop, the power consumption behavior of each electric appliance in the loop can be determined by simply comparing the loop factor value with previously defined character values of the power consumption behavior combinations. Thereby, it is not needed to dispose an additional measuring device on each electric appliance, and accordingly the cost for recognizing the power consumption behaviors of the electric appliances is greatly reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A and FIG. 3B are diagrams of a behavior-factor mapping table according to an embodiment of the present invention.

DESCRIPTION OF THE EMBODIMENTS

Figure 1:
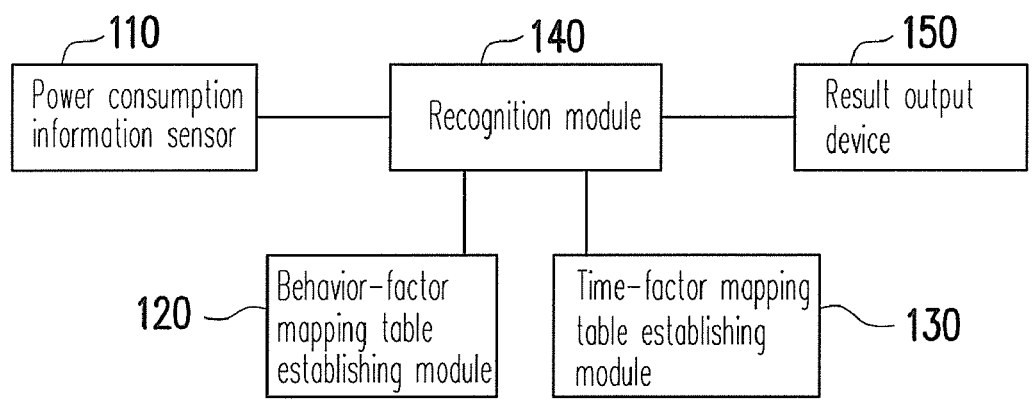
FIG. 1 is a block diagram of a system for recognizing the power consumption behaviors of electric appliances in a loop according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a system for recognizing the power consumption behavior of electric appliances in a loop according to an embodiment of the present invention. Referring to FIG. 1, the power consumption behavior recognition system 100 includes a power consumption information sensor 110, a behavior-factor mapping table establishing module 120, a time-factor mapping table establishing module 130, a recognition module 140, and a result output device 150.

The power consumption information sensor 110 detects the value of a single power consumption information of the loop. Namely, the power consumption information sensor 110 is capable of detecting a single power consumption information. The power consumption information sensor 110 may be an ammeter, an electricity meter, a watt-hour meter, or a power meter, and the power consumption information may be power, volt-ampere, volt, watt-hour, kilowatt-hour, reactive power, or current. The power consumption information sensor 110 is disposed at a place where it is allowed to detect the value of a power consumption information of the entire loop. For example, the power consumption information sensor 110 is disposed on a residential panel meter when the power consumption behaviors of the electric appliances in a residential environment are to be detected.

The behavior-factor mapping table establishing module 120 provides a behavior-factor mapping table. The behavior-factor mapping table records the mapping relationship between power consumption behavior combinations and combinative factor values. The behavior-factor mapping table establishing module 120 generates the content of the behavior-factor mapping table before the power consumption behavior recognition system 100 starts working. To be specific, the behavior-factor mapping table establishing module 120 collects the variation value of the power consumption information on each of the existing electric appliances in the loop under each of the power consumption behaviors of the existing electric appliance and obtains the main loop factor value corresponding to each power consumption behavior of each existing electric appliance according to the variation value of the power consumption information. The variation value of the power consumption information may be divided into a stable portion and an instable portion through different statistical method. In the present embodiment, the main loop factor value corresponding to each power consumption behavior of each existing electric appliance is a statistic of all the stable values. Herein the method for obtaining the statistic is not limited, and the statistic may be obtained by calculating an arithmetic mean, a normal distribution, or a mode.

Next, all the power consumption behaviors of all the existing electric appliances are permuted to generate a plurality of existing power consumption behavior combinations. The behavior-factor mapping table establishing module 120 adds up the main loop factor values corresponding to the power consumption behaviors within each of the existing power consumption behavior combinations to generate an existing combinative factor value corresponding to the existing power consumption behavior combination. Finally, the behavior-factor mapping table establishing module 120 records the existing power consumption behavior combinations and the corresponding existing combinative factor values into a behavior-factor mapping table.

Assuming that there are i existing electric appliances in the loop, in the present embodiment, the number N of all the power consumption behavior combinations and the combinative factor value corresponding to a power consumption behavior combination X are expressed in following expression:

$$N = \prod_i S_i, \quad X = \sum_i P_i$$

In foregoing expression, $S_i$ represents all the possible power consumption behaviors of the existing electric appliance i, and $P_i$ represents the main loop factor values of the existing electric appliance i under the power consumption behaviors defined by the X power consumption behavior combinations.

It should be especially noted that besides establishing the behavior-factor mapping table before the power consumption behavior recognition system 100 starts working, the behavior-factor mapping table establishing module 120 also updates the content of the behavior-factor mapping table in real time when the power consumption behavior recognition system 100 is in operation, and the detail will be described below.

The time-factor mapping table establishing module 130 provides a time-factor mapping table for recording the mapping relationship between each power consumption behavior and a factor value. Before the power consumption behavior recognition system 100 starts working, the time-factor mapping table establishing module 130 collects the variation value of the power consumption information on each of the existing electric appliances in the loop under each of the power consumption behaviors of the existing electric appliance and obtains the loop accessorial factor value corresponding to each power consumption behavior of each existing electric appliance. In the present embodiment, the time for the variation value of the power consumption information on each existing electric appliance under each power consumption behavior is served as the loop accessorial factor value of the power consumption behavior. The time-factor mapping table establishing module 130 records the power consumption behaviors of the existing electric appliances in the loop and the corresponding loop accessorial factor values in the time-factor mapping table. Similarly, the time-factor mapping table establishing module 130 updates the content of the time-factor mapping table in real time when the power consumption behavior recognition system 100 is in operation, and the time point and method for updating the content of the time-factor mapping table will be described below.

The recognition module 140 is coupled to the power consumption information sensor 110, the behavior-factor mapping table establishing module 120, and the time-factor mapping table establishing module 130. After obtaining the value of the power consumption information of the loop detected by the power consumption information sensor 110, the recognition module 140 determines a current electric appliance power consumption behavior of the loop by comparing the two mapping tables provided by the behavior-factor mapping table establishing module 120 and the time-factor mapping table establishing module 130. If no comparison result is generated due to insufficient information in the mapping tables, the recognition module 140 notifies the behavior-factor mapping table establishing module 120 and the time-factor mapping table establishing module 130 to update the contents of the mapping tables before it continues to compare the contents of the mapping tables.

The result output device 150 coupled to the recognition module 140 displays the current electric appliance power consumption behavior of the loop. The result output device 150 may be a computer system, a server, or an information presentation panel and coupled to the recognition module 140 through a wired or wireless network so as to obtain and display the current electric appliance power consumption behavior of the loop recognized by the recognition module 140.

The power consumption behavior recognition system 100 works by taking each loop as a unit, and it does not require any additional measuring device to be disposed on each electric appliance in the loop. Accordingly, the cost of the entire system is reduced. Besides, since the power consumption behaviors of the electric appliances in the loop are recognized according to a single power consumption information, the calculation is simplified and accordingly the recognition efficiency is greatly increased.

Figure 2:
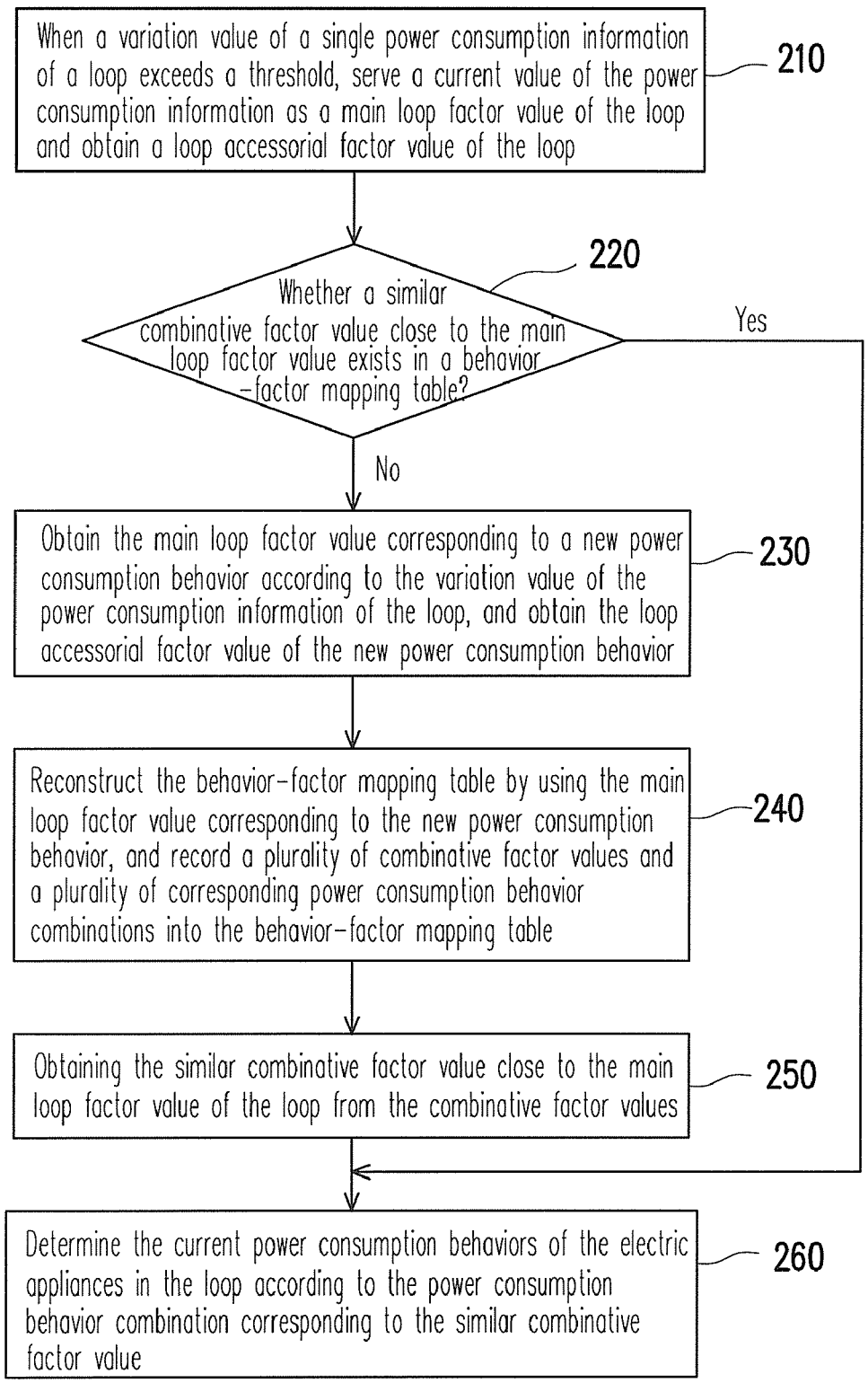
FIG. 2 is a flowchart of a method for recognizing the power consumption behaviors of electric appliances in a loop according to an embodiment of the present invention.

Below, the operations of the power consumption behavior recognition system 100 will be described in detail with reference to another embodiment of the present invention. FIG. 2 is a flowchart of a method for recognizing the power consumption behavior of electric appliances in a loop according to an embodiment of the present invention. Please refer to both FIG. 1 and FIG. 2 regarding following description.

After the power consumption behavior recognition system 100 starts working, the power consumption information sensor 110 constantly (or at constant time intervals) detects the value of a single power consumption information of the loop. In step 210, if a variation value of the power consumption information exceeds a threshold, the recognition module 140 serves the current value of the power consumption information as the main loop factor value of the loop. In the present embodiment, the threshold may be determined by a user or the smallest measurement difference between the power consumption information on all the electric appliances in the loop.

In addition, the recognition module 140 also obtains the time for the variation value of the power consumption information of the loop to stabilize and serves the time as the loop accessorial factor value of the loop. To be specific, the variation value of the power consumption information can be divided into a stable and an instable portion through a statistical method, and the loop accessorial factor value is the time of the instable value. Namely, it takes this time for the value of the power consumption information to stabilize.

After obtaining the two factor values indicating the current status of the loop, in step 220, the recognition module 140 determines whether a similar combinative factor value close to the main loop factor value of the loop exists in the behavior-factor mapping table. To be specific, the recognition module 140 compares the main loop factor value of the loop with each combinative factor value recorded in the behavior-factor mapping table, and the recognition module 140 determines that the similar combinative factor value exists in the behavior-factor mapping table only when the difference between a combinative factor value recorded in the behavior-factor mapping table and the main loop factor value of the loop is within a specific range.

If the similar combinative factor value is not found in the behavior-factor mapping table, it may be that the behavior-factor mapping table does not contain any information or the difference between every combinative factor value in the behavior-factor mapping table and the main loop factor value of the loop exceeds the specific range. In this case, in step 230, the recognition module 140 obtains the main loop factor value corresponding to a new power consumption behavior according to the variation value of the power consumption information. In the present embodiment, the recognition module 140 first obtains a plurality of continuous values according to the variation value of the power consumption information detected by the power consumption information sensor 110, wherein the difference between any two of the values is within a stable range. Foregoing values may be obtained through variance calculation or other statistical methods. Thereafter, the recognition module 140 gathers statistic on the values to obtain a stationary statistic, wherein the values may be sorted by calculating an arithmetic mean, a normal distribution, or a mode. However, the method for sorting the values is not limited in the present invention. Finally, the recognition module 140 deducts the stationary statistic from a previous value of the power consumption information and serves the result as the main loop factor value corresponding to the new power consumption behavior.

In addition, the recognition module 140 also obtains the time for the variation value of the power consumption information to stabilize as a loop accessorial factor value of the new power consumption behavior. The method for obtaining the loop accessorial factor value of the new power consumption behavior is the same as or similar to that for obtaining the loop accessorial factor value of the loop therefore will not be described herein.

Next, in step 240, the recognition module 140 notifies the behavior-factor mapping table establishing module 120 to reconstruct the behavior-factor mapping table by using the main loop factor value corresponding to the new power consumption behavior and record a plurality of combinative factor values and a plurality of corresponding power consumption behavior combinations generated during the reconstruction into the behavior-factor mapping table. Below, how the behavior-factor mapping table is reconstructed will be described in detail.

First, the behavior-factor mapping table establishing module 120 obtains a behavior type defined with respect to the new power consumption behavior. The behavior type may be provided by a user and which may be the name and status of an electric appliance (for example, "electric appliance A is high", "electric appliance A is low", or "electric appliance B is on"). However, foregoing format of the behavior type is only an example, and the format of the behavior type is not limited in the present invention.

Next, the behavior-factor mapping table establishing module 120 determines whether the behavior-factor mapping table contains any information (for example, existing power consumption behavior combinations and existing combinative factor values). If the behavior-factor mapping table is empty, the behavior-factor mapping table establishing module 120 directly inserts the new power consumption behavior into the behavior-factor mapping table as the first power consumption behavior combination (i.e., the power consumption behavior combination contains only one power consumption behavior) and records the main loop factor value corresponding to the new power consumption behavior into the behavior-factor mapping table as the combinative factor value of the power consumption behavior combination.

If the behavior-factor mapping table contains one or more existing power consumption behavior combinations, the behavior-factor mapping table establishing module 120 permutes the new power consumption behavior and the existing power consumption behavior combinations to generate a plurality of new power consumption behavior combinations. Besides, the behavior-factor mapping table establishing module 120 adds up the main loop factor values corresponding to the power consumption behaviors within each of the new power consumption behavior combinations and serves the sum as the combinative factor value of the power consumption behavior combination.

Referring to FIG. 3A, the behavior-factor mapping table 300 already records the data corresponding to six power consumption behavior combinations and combinative factor values, and the data is constructed according to the existing electric appliance A and electric appliance B in the loop. In the present embodiment, the power consumption information is power, the electric appliance A has three power consumption behaviors as "high", "low", and "off" (denoted as "A high", "A low", and "A off"), and the main loop factor values corresponding to the power consumption behaviors are 35 watt, 25 watt, and 0 watt. The electric appliance B has two power consumption behaviors as "on" and "off" (denoted as "B on" and "B off"), and the main loop factor values corresponding to the power consumption behaviors are 125 watt and 0 watt. When a new electric appliance C is added into the loop and turned on, the variation value of the power consumption information of the loop exceeds a threshold. Assuming that the behavior type of the new power consumption behavior is defined as "C on" (with a corresponding power consumption behavior "C off"), the main loop factor value corresponding to the power consumption behavior "C on" is 210 watt, and the main loop factor value corresponding to the power consumption behavior "C off" is 0 watt, twelve new power consumption behavior combinations (as shown in the power consumption behavior combination field in FIG. 3B) are then generated by permuting the new power consumption behavior "C on" and the original six existing power consumption behavior combinations. Taking the fourth power consumption behavior combination in FIG. 3B as an example, the power consumption behaviors within the power consumption behavior combination are "A off", "B on", and "C on". Accordingly, the combinative factor value corresponding to the power consumption behavior combination is 335 watt (0+125+210).

In addition, the recognition module 140 also notifies the time-factor mapping table establishing module 130 to update the content of the time-factor mapping table. After obtaining the behavior type defined with respect to the new power consumption behavior, the time-factor mapping table establishing module 130 adds a new record into the time-factor mapping table to record the mapping relationship between the new power consumption behavior and the loop accessorial factor value thereof.

Next, referring to FIG. 2, in step 250, the recognition module 140 compares the main loop factor value of the loop with each combinative factor value in the behavior-factor mapping table to obtain a similar combinative factor value close to the main loop factor value of the loop from the combinative factor values. Namely, all the combinative factor values having their differences from the main loop factor value of the loop within a specific range are obtained.

Figure 4:
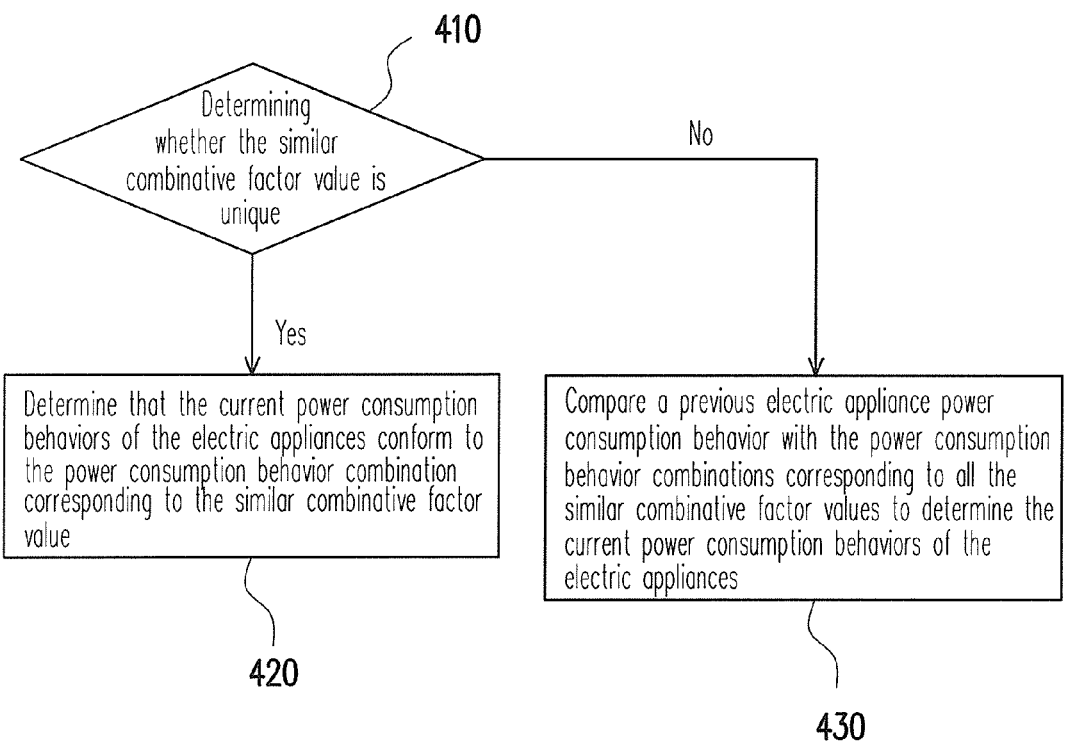
FIG. 4 is a flowchart illustrating how a current electric appliance power consumption behavior is determined according to a similar combinative factor value according to an embodiment of the present invention.

Finally, in step 260, the recognition module 140 determines the current electric appliance power consumption behavior of the loop according to the power consumption behavior combination corresponding to the similar combinative factor value. Below, the step 260 will be described in detail with reference to FIG. 4. First, in step 410, the recognition module 140 determines whether the similar combinative factor value is unique. If the similar combinative factor value is unique, in step 420, the recognition module 140 determines that the current electric appliance power consumption behavior of the loop conform to the power consumption behavior combination corresponding to the similar combinative factor value.

If the similar combinative factor value is not unique, in step 430, the recognition module 140 compares a previous electric appliance power consumption behavior of the loop with the power consumption behavior combinations corresponding to all the similar combinative factor values and determines the power consumption behavior combination having the smallest variation from the previous electric appliance power consumption behavior of the loop as the current electric appliance power consumption behavior of the loop.

Additionally, when the similar combinative factor value is not unique, the recognition module 140 compares the previous electric appliance power consumption behavior of the loop with the power consumption behavior combinations corresponding to all the similar combinative factor values to find out several power consumption behavior combinations with small variations from the previous electric appliance power consumption behavior of the loop. Then, the recognition module 140 compares the loop accessorial factor value of the loop with the time-factor mapping table to locate the current electric appliance power consumption behavior of the loop from the candidate power consumption behavior combinations.

Referring to FIG. 2 again, in step 220, if the recognition module 140 finds the similar combinative factor value close to the main loop factor value of the loop from the behavior-factor mapping table, then as shown in step 260, the recognition module 140 determines the current electric appliance power consumption behavior of the loop according to the power consumption behavior combination corresponding to the similar combinative factor value. The detail of this step has been described above therefore will not be described herein.

Once the power consumption behaviors of the electric appliances in the loop are recognized, the result output device 150 outputs the recognition result to be inspected by a user. By recording every recognition result, the status change and using time of each electric appliance in the loop can be further determined, and accordingly electricity consumption expense thereof can be calculated.

During the operation of the power consumption behavior recognition system 100, if the recognition module 140 cannot obtain appropriate reference data from the behavior-factor mapping table, the recognition module 140 notifies the behavior-factor mapping table establishing module 120 to reconstructing the behavior-factor mapping table by using new information and notifies the time-factor mapping table establishing module 130 to update the content of the time-factor mapping table. In other words, the power consumption behavior recognition system 100 is capable of online learning, and which can directly determine the power consumption behaviors of the electric appliances in the loop without spending system learning time to establishing the mapping tables in advance.

The present invention also provides a computer program product for executing the method described above for recognizing the power consumption behaviors of electric appliances in a loop. The computer program product is composed of a plurality of program instructions (for example, a setting program instruction and a deployment program instruction, etc). These program instructions can be loaded into a computer system and executed by the same to accomplish the electric appliance power consumption behavior recognition method described above and allow the computer system to recognize the power consumption behavior of each electric appliance in a loop by using a single power consumption information sensor.

As described above, in embodiments of the present invention, the factor value of each power consumption behavior of each electric appliance is constructed according to the variation of a single power consumption information, so as to establish a mapping table between power consumption behavior combinations and corresponding factor values. When the variation value of the power consumption information of the entire loop exceeds a threshold, the current electric appliance power consumption behavior of the loop is determined according to the factor values of the loop through table lookup. In particular, a very accurate recognition result can be generated when the electric appliances in the loop are mostly stationary electric appliances and the factor values thereof are very different. Moreover, because the contents of the mapping tables can be updated in real time during the operation of the system, the time for the system to establish the mapping tables can be saved. Furthermore, it is not needed to disposing an additional measuring device on each of the electric appliances so that the cost on both labor and money can be greatly reduced.

It will be apparent to those skilled in the art that various modifications and variation values can be made to the structure of the present invention without departing from the scope or spirit of the invention. In view of the foregoing, it is intended that the present invention cover modifications and variation values of this invention provided they fall within the scope of the following claims and their equivalents.

What is claimed is:

1. A method for recognizing power consumption behaviors of electric appliances in a loop, comprising:
when a variation value of a single power consumption information of the loop exceeds a threshold, serving a current value of the power consumption information as a main loop factor value of the loop;
determining whether a similar combinative factor value close to the main loop factor value exists in a behavior-factor mapping table;
if the similar combinative factor value does not exist in the behavior-factor mapping table, obtaining the main loop factor value corresponding to a new power consumption behavior according to the variation value of the power consumption information of the loop;
reconstructing the behavior-factor mapping table by using the main loop factor value corresponding to the new power consumption behavior, and recording a plurality of combinative factor values and a plurality of corresponding power consumption behavior combinations into the behavior-factor mapping table; and
obtaining the similar combinative factor value close to the main loop factor value of the loop from the combinative factor values, and determining a current electric appliance power consumption behavior of the loop according to the power consumption behavior combination corresponding to the similar combinative factor value.

2. The method according to claim 1, wherein after the step of determining whether the similar combinative factor value exists in the behavior-factor mapping table, the method further comprises:
if the similar combinative factor value exists in the behavior-factor mapping table, determining the current electric appliance power consumption behavior of the loop according to the power consumption behavior combination corresponding to the similar combinative factor value.

3. The method according to claim 1, wherein the step of determining whether the similar combinative factor value exists in the behavior-factor mapping table comprises:
determining that the similar combinative factor value exists in the behavior-factor mapping table if the behavior-factor mapping table contains combinative factor values having differences from the main loop factor value of the loop within a specific range.

4. The method according to claim 1, wherein the step of obtaining the main loop factor value corresponding to the new power consumption behavior according to the variation value of the power consumption information comprises:
obtaining a plurality of continuous values according to the variation value of the power consumption information, wherein a difference between any two of the values is within a stable range;
gathering statistics on the values to obtain a stationary statistic; and
deducting the stationary statistic from a previous value of the power consumption information of the loop to obtain the main loop factor value corresponding to the new power consumption behavior.

5. The method according to claim 1, wherein the step of reconstructing the behavior-factor mapping table by using the main loop factor value corresponding to the new power consumption behavior and recording the combinative factor values and the corresponding power consumption behavior combinations into the behavior-factor mapping table comprises:
defining a behavior type of the new power consumption behavior;
if the behavior-factor mapping table records a plurality of existing power consumption behavior combinations, permuting the new power consumption behavior and the existing power consumption behavior combinations to generate the power consumption behavior combinations, and serving a sum of the main loop factor values corresponding to the power consumption behaviors within each of the power consumption behavior combinations as the combinative factor value corresponding to the power consumption behavior combination; and
if the behavior-factor mapping table does not record any existing power consumption behavior combination, inserting the new power consumption behavior into the behavior-factor mapping table as a first power consumption behavior combination, and serving the main loop factor value corresponding to the new power consumption behavior as the combinative factor value of the first power consumption behavior combination.

6. The method according to claim 5, wherein the step of serving the current value of the power consumption information as the main loop factor value of the loop when the variation value of the power consumption information of the loop exceeds the threshold further comprises:

obtaining a time for the variation value of the power consumption information of the loop to stabilize as a loop accessorial factor value of the loop;

the step of obtaining the main loop factor value corresponding to the new power consumption behavior according to the variation value of the power consumption information of the loop further comprises:

obtaining the time for the variation value of the power consumption information of the loop to stabilize as the loop accessorial factor value corresponding to the new power consumption behavior; and the step of reconstructing the behavior-factor mapping table by using the main loop factor value corresponding to the new power consumption behavior further comprises:

recording a mapping relationship between the new power consumption behavior and the loop accessorial factor value into a time-factor mapping table.

7. The method according to claim 6, wherein the step of determining the current electric appliance power consumption behavior of the loop according to the power consumption behavior combination corresponding to the similar combinative factor value comprises:

determining whether the similar combinative factor value is unique;

if the similar combinative factor value is unique, determining that the current electric appliance power consumption behavior conforms to the power consumption behavior combination corresponding to the similar combinative factor value; and if the similar combinative factor value is not unique, comparing a previous electric appliance power consumption behavior of the loop with the power consumption behavior combinations corresponding to all the similar combinative factor values to determine the current electric appliance power consumption behavior, or further comparing the loop accessorial factor value of the loop with the time-factor mapping table to determine the current electric appliance power consumption behavior.

8. The method according to claim 1 further comprising:

collecting the variation value of the power consumption information on each of a plurality of existing electric appliances in the loop under each of a plurality of power consumption behaviors of the existing electric appliance, so as to obtain the main loop factor value and a loop accessorial factor value corresponding to the power consumption behavior;

permuting the power consumption behaviors of the existing electric appliances to generate a plurality of existing power consumption behavior combinations;

adding up the main loop factor values corresponding to the power consumption behaviors within each of the existing power consumption behavior combinations, so as to obtain an existing combinative factor value corresponding to the existing power consumption behavior combination;

recording the existing power consumption behavior combinations and the corresponding existing combinative factor values in the behavior-factor mapping table; and recording the power consumption behaviors of the existing electric appliances and the corresponding loop accessorial factor values into a time-factor mapping table.

9. A system for recognizing power consumption behaviors of electric appliances in a loop, comprising:

a power consumption information sensor, for detecting a value of a single power consumption information of the loop;

a behavior-factor mapping table establishing module, for providing a behavior-factor mapping table; and a recognition module, coupled to the power consumption information sensor and the behavior-factor mapping table establishing module, wherein when a variation value of the power consumption information of the loop exceeds a threshold, the recognition module serves a current value of the power consumption information as a main loop factor value of the loop and determines whether a similar combinative factor value close to the main loop factor value exists in the behavior-factor mapping table;

if the similar combinative factor value does not exist in the behavior-factor mapping table, the recognition module obtains the main loop factor value corresponding to a new power consumption behavior according to the variation value of the power consumption information of the loop, notifies the behavior-factor mapping table establishing module to reconstruct the behavior-factor mapping table by using the main loop factor value corresponding to the new power consumption behavior, and records a plurality of combinative factor values and a plurality of corresponding power consumption behavior combinations into the behavior-factor mapping table;

the recognition module obtains the similar combinative factor value close to the main loop factor value of the loop from the combinative factor values and determines a current electric appliance power consumption behavior of the loop according to the power consumption behavior combination corresponding to the similar combinative factor value.

10. The system according to claim 9, wherein if the similar combinative factor value close to the main loop factor value of the loop exists in the behavior-factor mapping table, the recognition module determines the current electric appliance power consumption behavior of the loop according to the power consumption behavior combination corresponding to the similar combinative factor value.

11. The system according to claim 9, wherein the recognition module determines that the similar combinative factor value exists in the behavior-factor mapping table when the behavior-factor mapping table contains combinative factor values having differences from the main loop factor value of the loop within a specific range.

12. The system according to claim 9, wherein the recognition module obtains a plurality of continuous values according to the variation value of the power consumption information, gathers statistic on the values to obtain a stationary statistic, and deducts the stationary statistic from a previous value of the power consumption information of the loop to obtain the main loop factor value corresponding to the new power consumption behavior, wherein a difference between any two of the values is within a stable range.

13. The system according to claim 9, wherein the behavior-factor mapping table establishing module obtains a behavior type defined with respect to the new power consumption behavior, if the behavior-factor mapping table records a plurality of existing power consumption behavior combinations, the behavior-factor mapping table establishing module permutes the new power consumption behavior and the existing power consumption behavior combinations to generate the power consumption behavior combinations, and the behavior-factor mapping table establishing module serves a sum of the main loop factor values corresponding to the power consumption behaviors within each of the power consumption behavior combinations as the combinative factor value corresponding to the power consumption behavior combination, if the behavior-factor mapping table does not record any existing power consumption behavior combination, the behavior-factor mapping table establishing module inserts the new power consumption behavior into the behavior-factor mapping table as a first power consumption behavior combination and serves the main loop factor value corresponding to the new power consumption behavior as the combinative factor value of the first power consumption behavior combination.

14. The system according to claim 9, wherein when the variation value of the power consumption information of the loop exceeds the threshold, the recognition module obtains a time for the variation value of the power consumption information to stabilize as a loop accessorial factor value of the loop, and while obtaining the main loop factor value corresponding to the new power consumption behavior according to the variation value of the power consumption information of the loop, the recognition module also obtains the time for the variation value of the power consumption information to stabilize as the loop accessorial factor value of the new power consumption behavior.

15. The system according to claim 14 further comprising:
a time-factor mapping table establishing module, coupled to the recognition module, for recording a mapping relationship between the new power consumption behavior and the loop accessorial factor value into a time-factor mapping table.

16. The system according to claim 15, wherein the recognition module determines whether the similar combinative factor value is unique, if the similar combinative factor value is unique, the recognition module determines that the current electric appliance power consumption behavior conforms to the power consumption behavior combination corresponding to the similar combinative factor value, if the similar combinative factor value is not unique, the recognition module compares a previous electric appliance power consumption behavior of the loop with the power consumption behavior combinations corresponding to all the similar combinative factor values to determine the current electric appliance power consumption behaviour, or further compares the loop accessorial factor value of the loop with the time-factor mapping table to determine the current electric appliance power consumption behavior.

17. The system according to claim 15, wherein the behavior-factor mapping table establishing module collects the main loop factor value corresponding to the new power consumption behavior obtained according to the variation value of the power consumption information on each of a plurality of existing electric appliances in the loop under each of a plurality of power consumption behaviors of the existing electric appliance, permutes the power consumption behaviors of the existing electric appliances to generate a plurality of existing power consumption behavior combinations, adds up the main loop factor values corresponding to the power consumption behaviors within each of the existing power consumption behavior combinations to obtain a existing combinative factor value corresponding to the existing power consumption behavior combination, and records the existing power consumption behavior combinations and the corresponding existing combinative factor values into the behavior-factor mapping table, the time-factor mapping table establishing module collects the loop accessorial factor value of the new power consumption behavior obtained according to the variation value of the power consumption information on each of the existing electric appliances under each of the power consumption behaviors of the existing electric appliance and records the power consumption behaviors of the existing electric appliances and the corresponding loop accessorial factor values into the time-factor mapping table.

18. The system according to claim 9 further comprising:
a result output device, coupled to the recognition module, for displaying the current electric appliance power consumption behavior.

19. The system according to claim 9, wherein the power consumption information comprises one of power, volt-ampere, volt, watt-hour, kilowatt-hour, reactive power, and current, and the power consumption information sensor comprises one of an ammeter, an electricity meter, a watt-hour meter, and a power meter.

* * * * *